United States Patent [19]
Corisis et al.

[11] Patent Number: 6,061,242
[45] Date of Patent: May 9, 2000

[54] DIE PADDLE HEAT SINK WITH THERMAL POSTS

[75] Inventors: David J. Corisis; Walter L. Moden, both of Meridian, Id.

[73] Assignee: Micron Technology, Inc., Boise, Id.

[21] Appl. No.: 09/257,567

[22] Filed: Feb. 25, 1999

[51] Int. Cl.[7] .................................................. H05K 7/20
[52] U.S. Cl. .................. 361/704; 361/702; 361/737; 361/773; 361/760; 257/678; 257/707; 257/723; 174/16.3
[58] Field of Search ...................................... 361/772, 773, 361/760, 825, 702–710, 717–719, 732–737, 749, 753; 257/673–678, 696, 723, 692, 701, 693, 707–727; 29/827, 707; 174/16.3, 52.4, 260, 252.4; 165/80.2, 80.3, 80.4, 185

[56] References Cited

U.S. PATENT DOCUMENTS

| | | | |
|---|---|---|---|
| 5,305,179 | 4/1994 | Sono et al. | 361/718 |
| 5,359,493 | 10/1994 | Chiu | 361/719 |
| 5,394,607 | 3/1995 | Chiu et al. | 29/827 |
| 5,402,006 | 3/1995 | O'Donley | 257/796 |
| 5,432,678 | 7/1995 | Russel et al. | 361/760 |
| 5,458,716 | 10/1995 | Alfaro et al. | 156/245 |
| 5,605,863 | 2/1997 | Wills et al. | 437/182 |
| 5,650,915 | 7/1997 | Alfaro et al. | 361/707 |
| 5,708,567 | 1/1998 | Shim et al. | 361/723 |
| 5,798,570 | 8/1998 | Watanabe et al. | 257/796 |
| 5,827,999 | 10/1998 | McMillan et al. | 174/52.4 |

*Primary Examiner*—Leo P. Picard
*Assistant Examiner*—Michael Datskovsky
*Attorney, Agent, or Firm*—Schwegman, Lundberg, Woessner & Kluth, P.A.

[57] ABSTRACT

A semiconductor device having a die paddle and a die disposed on the die paddle. The die paddle serves as a heat dissipation device and the die paddle is partially and/or fully encapsulated by a package body. Thermal posts extend from the die paddle to direct heat from the semiconductor device to a printed circuit board and further provide stability and alignment during placement of the semiconductor device on the printed circuit board.

50 Claims, 5 Drawing Sheets

DIE PADDLE HEAT SINK WITH THERMAL POSTS

RELATED APPLICATIONS

This patent application is related to an applications entitled "VERTICAL SURFACE MOUNT APPARATUS WITH THERMAL CARRIER", having Ser. No. 09/060,562, which was filed on Apr. 15, 1998; and "INTEGRATED CIRCUIT PACKAGE ALIGNMENT FEATURE," having Ser. No. 08/929,843, which was filed on Sep. 15, 1997.

FIELD OF THE INVENTION

The present invention relates generally to semiconductor packaging mounting packages. More particularly, it pertains to heat dissipation for a semiconductor packaging mounting package.

BACKGROUND OF THE INVENTION

Integrated circuits are being produced with diminishing geometries and increasing densities. Associated with the increase in density is an increase in the amount of heat generated by a semiconductor die per square unit of area, and also increased power consumption.

Increased semiconductor device power consumption and increased density translates into increased semiconductor device operating temperatures. Heat generated by a semiconductor device migrates through the plastic packaging material and can reach damaging temperatures, where sustained high operating temperatures can result in a decrease in performance of the semiconductor device or even semiconductor device failure. In addition, the high temperatures can result in a process of decomposition resulting in package cracking and eventual device failure.

Traditional methods for removing excess semiconductor device heat include liquid cooling, forced air cooling, coupling the device with an external heat sink, or a combination of these methods. Liquid cooling or forced air cooling can be difficult and costly to implement, especially in light of space limitations. Heat sink misalignment can result in a decrease in performance of the semiconductor device or even yield losses. Furthermore, the heat spreader is costly to implement given the additional material cost, and the cost of labor to attach the external heat sink.

Accordingly, what is needed is a more efficient manner to cool a packaged device. What is also needed is a method of cooling a packaged device which can be easily incorporated into current manufacturing processes.

SUMMARY OF THE INVENTION

A semiconductor device which is capable of dissipating heat includes a die paddle including an integral heat dissipation device and a semiconductor die, which is thermally coupled with the die paddle. The semiconductor die is coupled with the die paddle with a thermally conductive paste, a non-conductive paste, or double-sided tape, or other equivalent methods or materials. In addition, a package of plastic or other suitable material encompasses at least a portion of, or optionally fully, the semiconductor die and the die paddle.

In one embodiment, the package encompasses about 50% of the die paddle. In another embodiment, the package encompasses about 80% of the die paddle. In yet another embodiment, the package encompasses about 95% of the die paddle. Alternatively, the package encompasses about 50%–95% of the die paddle. The die paddle has a front surface and a rear surface, and, in one embodiment, the semiconductor die is disposed on the front surface and the rear surface exposed to an environment. In another embodiment, the package encompasses side surfaces of the die paddle, and the rear surface is exposed to an environment.

In yet another embodiment, the die paddle is defined in part by a first surface area and the package is defined by a second surface area. The first surface area of the die paddle is maximized relative to the second surface area of the package.

The semiconductor further includes thermal posts which extend from with the die paddle. The thermal posts are adapted for attaching and aligning the semiconductor device with a printed circuit board and assist in directing heat from the semiconductor device to a printed circuit board. In addition, the semiconductor device optionally includes a lead electrically coupled with the semiconductor die, and the package encompasses a portion of the lead. Optionally, the die paddle comprises a ground plane.

The semiconductor device allows for increased heat dissipation therefrom without requiring additional heat sinks or heat slugs to be attached thereto. This reduces the overall cost of the semiconductor device since fewer parts are required and assembly time is thereby reduced. Furthermore, cycle time to produce the semiconductor device can be reduced since fewer parts are assembled. Using the die paddle as the heat dissipator provides for improved thermal performance and package reliability. Having the die paddle partially exposed facilitates improved heat dissipation through convection. In addition, the electrical performance of the semiconductor device is increased by reducing the loop inductance.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

Figure 1:
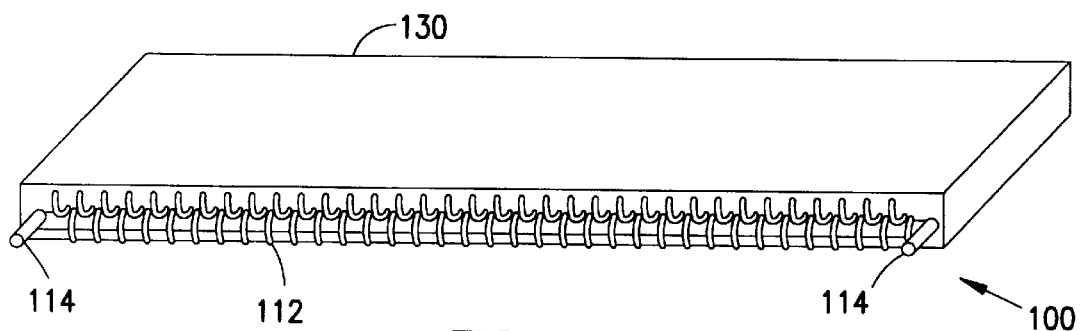
FIG. 1 is a perspective view illustrating a semiconductor device.
Figure 2:
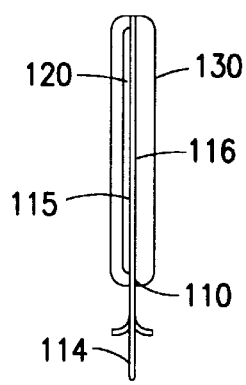
FIG. 2 is a side cut-away view illustrating a semiconductor device.

FIGS. 1 and 2 illustrate a first embodiment of a semiconductor device 100. The semiconductor device includes a die paddle 110 a semiconductor die 120, and a package body 130. The semiconductor device 100 further includes a plurality of vertical surface mount gull-wing zig-zag package leads 112 extending therefrom. The leads 112 extend from the die paddle 110 as will be further described below.

The semiconductor die 120 includes circuitry formed thereon. The semiconductor die 120 is attached to the die paddle 110 for example, by conductive paste. Alternatively, the semiconductor die 120 can be attached to the die paddle 110 using other methods or materials such as non-conductive paste or double sided tape. In addition, a pocket can be etched on the die paddle 110.

Figure 4:
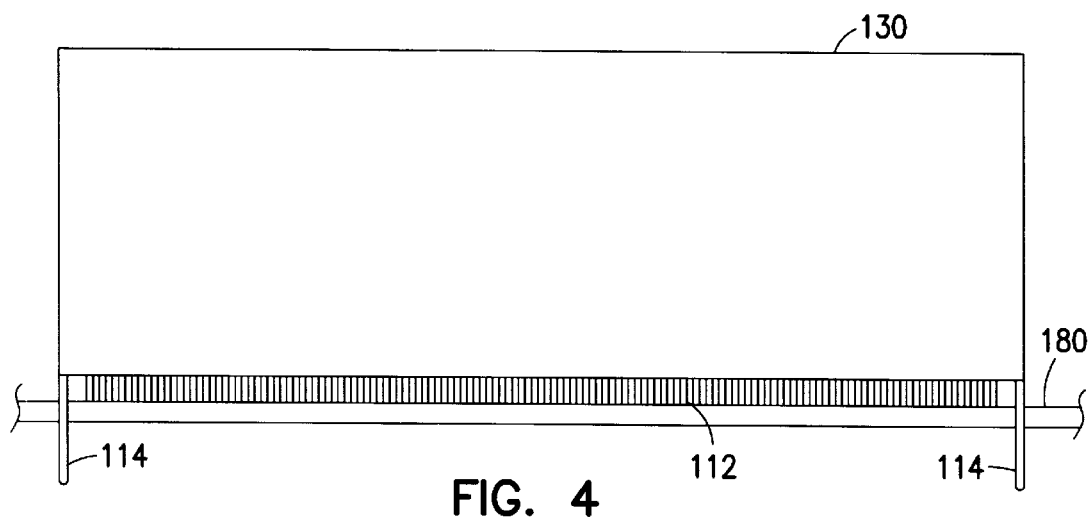
FIG. 4 is a front elevation illustrating a circuit board assembly.

The die paddle 110 is defined by a front surface 115, a rear surface 116, side surfaces 117, a top surface 118, and a bottom surface 119. The semiconductor side 120 is coupled with the front surface 115 of the die paddle 110 by methods or materials, as mentioned above. The die paddle 110 is coupled with a printed circuit board 180, where the bottom surface 119 is disposed proximate to the printed circuit board 180, as shown in FIG. 4.

Figure 3:
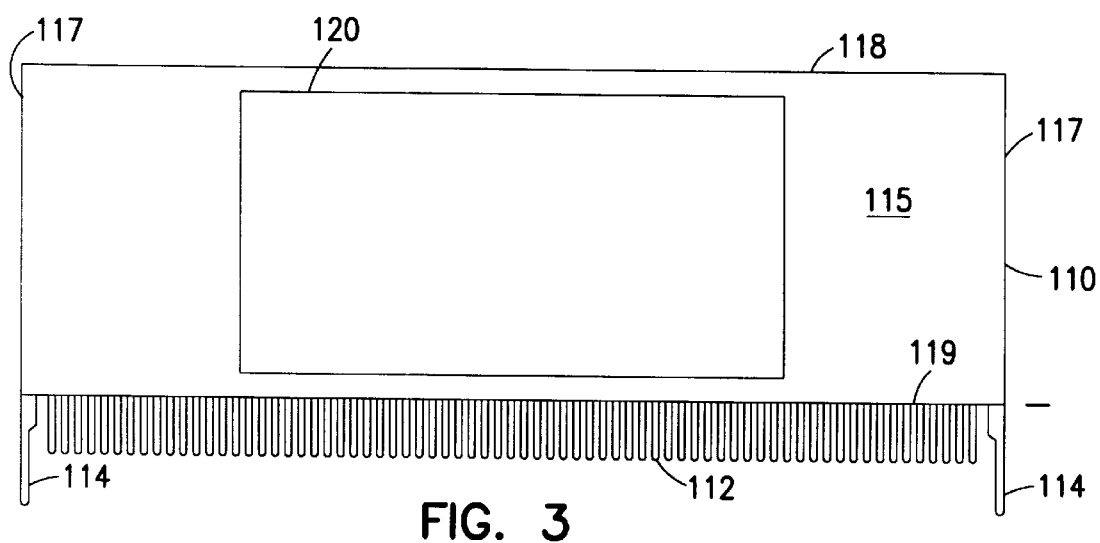
FIG. 3 is a front elevation illustrating the semiconductor device.

Referring to FIG. 3, the die paddle 110 includes leads 112 extending therefrom. The leads 112 extend out through the package body 130 and can be formed to accommodate a variety of mounting styles. The leads 112 allow for the electrical connection between the semiconductor device 100 and for instance, a printed circuit board 180, as shown in FIG. 4.

The die paddle 110 further includes thermal posts 114 extending therefrom, and are adapted to attach to a printed circuit board 180. The thermal posts 114 provide a thermal path from the die paddle 110 and the semiconductor device 100 to the printed circuit board 180, which directs heat away from the semiconductor device 100. The thermal posts 114 further provide alignment of the semiconductor device 100 while it is being installed on the printed circuit board 180. The thermal posts 114 further allow for mechanical support during placement of the semiconductor device 100 on the printed circuit board 180 and during the solder reflow operation, where the leads 112 are connected with the printed circuit board 180. Alternatively, the thermal posts 114 are connected to a ground on a printed circuit board, which allows for the die paddle 110 to serve as a ground.

The semiconductor device 100 further includes a package body 130, which completely encapsulates the die paddle 110 and the semiconductor die 120. The leads 112 and the thermal posts 114 extend outside of the package body 130 so as to allow connection with the printed circuit board 180. The package body 130 is formed of plastic. Alternatively, other electrically non-conductive materials can be used as well. The package body 130, in one embodiment, is molded over the die paddle 110, thereby encapsulating the die paddle 110. The package body 130 protects the semiconductor die 120 from the surrounding environment, and seals the die 120 therein. However, the package body 130 does not efficiently dissipate heat from the semiconductor device 100.

To assist in the dissipation of heat from the semiconductor device 100, the die paddle 110 is increased in size relative to the package body 130 to serve as a heat dissipation device. In one embodiment, the die paddle has substantially the same size as the package body 130. The heat dissipation device, which is directly and thermally coupled with the semiconductor die 120 and the printed circuit board 180 allows for heat to be more efficiently dissipated from the semiconductor device 100. The die paddle 110 is formed of a metal, which is a thermally conductive material. The die paddle 110 can be formed, for example, by stamping.

Figure 5:
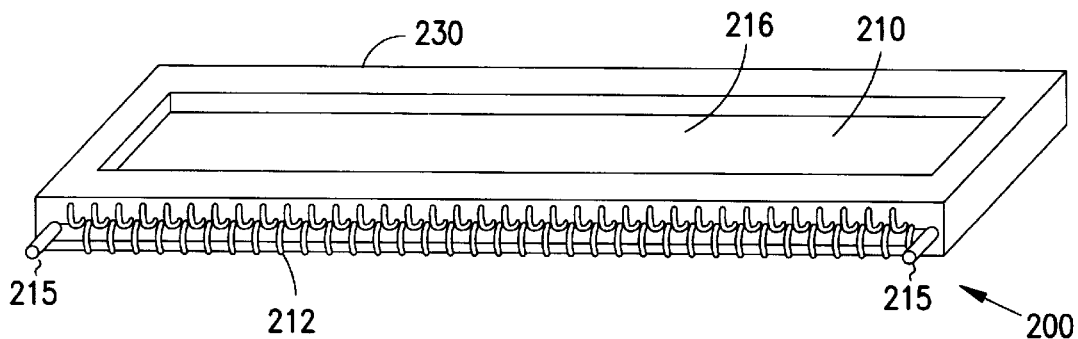
FIG. 5 is a perspective view illustrating a semiconductor device.
Figure 6:
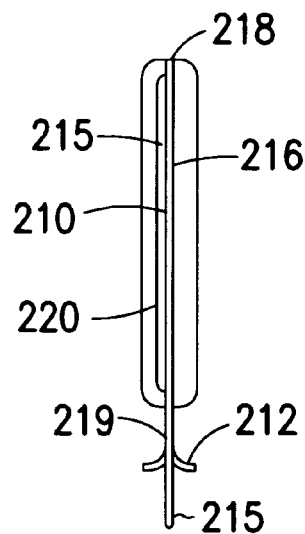
FIG. 6 is a side cut-away view illustrating a semiconductor device.
Figure 7:
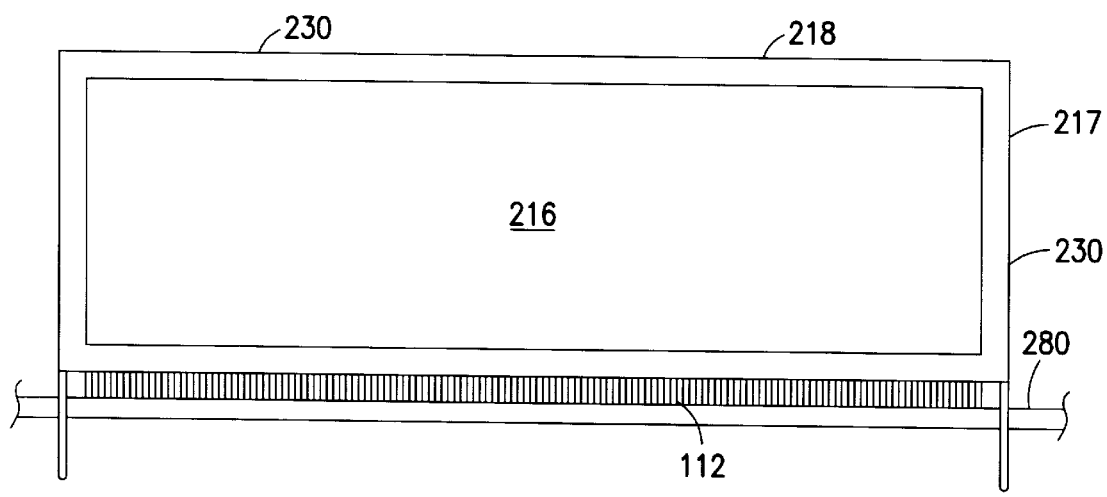
FIG. 7 is rear elevation illustrating a circuit board assembly.

FIGS. 5–7 illustrate another embodiment of a semiconductor device 200. The semiconductor device includes a die paddle 210, a semiconductor die 220, and a package body 230. The semiconductor device 200 further includes a plurality of vertical surface mount gull-wing zig-zag package leads 212 extending therefrom. The leads 212 extend from the die paddle 210 as will be further described below.

Figure 6A:
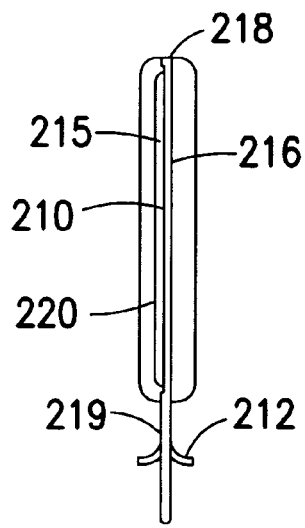
FIG. 6A is a cut-away view illustrating a semiconductor device.

As described above, the semiconductor die 220 includes circuitry formed thereon. The semiconductor die 220 is attached to the die paddle 210 for example, by conductive paste. Alternatively, the semiconductor die 220 can be attached to the die paddle 210 using other methods or materials such as non-conductive paste or double sided tape. In addition, a pocket 211 (FIG. 6A) can be etched on the die paddle 210. Alternatively, the semiconductor die 220 is mounted to the die paddle 210 using leads over chip (LOC) methods, as is known in the art. Wire bonding or an equivalent is used to connect selected bond pads on the die 220 to selected leads 212 or conductors of a lead frame.

The die paddle 210 is defined by a front surface 215, a rear surface 216, side surfaces 217, a top surface 218, and a bottom surface 219. The semiconductor side 220 is coupled with the front surface 215 of the die paddle 210 by methods or materials, as mentioned above. The die paddle 210 is coupled with a printed circuit board 280, where the bottom surface 219 is disposed proximate to the printed circuit board 280, as shown in FIG. 7. As shown in FIG. 5, the die paddle 210 includes leads 212 extending therefrom. The leads 212 extend out through the package body 230 and can be formed to accommodate a variety of mounting styles. The leads 212 allow for the electrical connection between the semiconductor device 200 and for instance, a printed circuit board 280, as shown in FIG. 7.

The die paddle 210 further includes thermal posts 214 extending therefrom, and are adapted to attach to a printed circuit board 280. The thermal posts 214 provide a thermal path from the die paddle 210 and the semiconductor device 200 to the printed circuit board 280, which directs heat away from the semiconductor device 200. The thermal posts 214 further provide alignment of the semiconductor device 200 while it is being installed on the printed circuit board 280. The thermal posts 214 further allow for mechanical support during placement of the semiconductor device 200 on the printed circuit board 280 and during the solder reflow operation, where the leads 212 are connected with the printed circuit board 280.

Figure 5A:
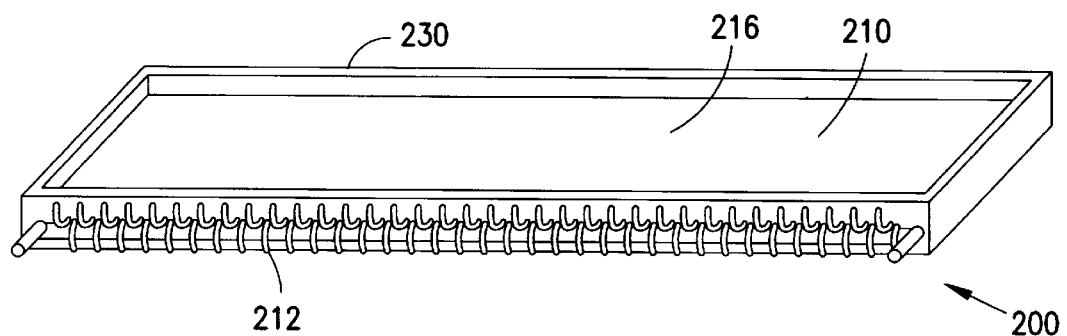
FIG. 5A is a perspective view illustrating a semiconductor device.

The semiconductor device 200 further includes a package body 230, which in one embodiment, at least partially encapsulates the die paddle 210 and the semiconductor die 220, where the rear surface 216 of the die paddle 210 is partially or fully exposed to the environment. The front surface 215, on which the semiconductor die 220 is disposed, is encapsulated by the package body 230. Alternatively, the side surfaces 217 of the die paddle 210 are encompassed by the package body 230. In one embodiment, the package body 230 encompasses at least 50% of the die paddle 210 (FIG. 5A).

Figure 5B:
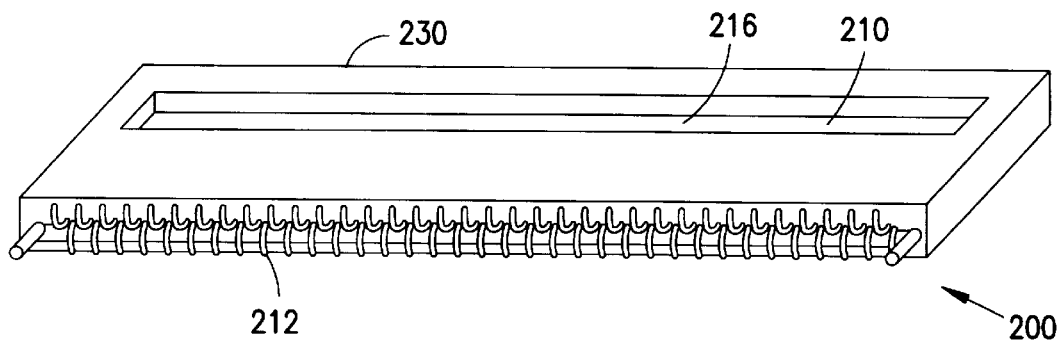
FIG. 5B is a perspective view illustrating a semiconductor device.

The package body 230, in another embodiment, encompasses at least 80% of the die paddle 210 (FIG. 5). In yet another embodiment, the die paddle 210 is encompassed at least 95% by the package body 230 (FIG. 5B). Alternatively, the die paddle 210 is encompassed between 50% and 95% by the package body. Having the die paddle 210 partially exposed to the environment aids in the dissipation of heat, and the semiconductor die 220 is protected from the environment. Heat dissipation can be further facilitated by drawing air, or another medium, over the exposed surface of the die paddle 210.

The leads 212 and the thermal posts 214 extend outside of the package body 230 so as to allow connection with the printed circuit board 280. In one embodiment, the package body 230 is formed of plastic. Alternatively, other electrically non-conductive materials can be used as well. The package body 230, in one embodiment, is molded over the die paddle 210, thereby encapsulating the die paddle 210. The package body 230 protects the semiconductor die 220 from the surrounding environment, and seals the die 220 therein. However, the package body 230 does not efficiently dissipate heat from the semiconductor device 200.

To assist in the dissipation of heat from the semiconductor device 200, the die paddle 210 is increased in size relative to the package body 230 to serve as a heat dissipation device. In one embodiment, the die paddle has substantially the same size as the package body 230. The heat dissipation device, which is directly and thermally coupled with the semiconductor die 220 and the printed circuit board 280 allows for heat to be more efficiently dissipated from the semiconductor device 200. The die paddle 210 is formed of a metal, which is a thermally conductive material. The die paddle 210 can be formed, for example, by stamping or other equivalent methods.

Advantageously, the semiconductor device allows for increased heat dissipation therefrom without requiring additional heat sinks or heat slugs to be attached thereto. This reduces the overall cost of the semiconductor device since fewer parts are required and assembly time is thereby reduced. Furthermore, cycle time to produce the semiconductor device can be reduced since fewer parts are assembled. Using the die paddle as the heat dissipator provides for improved thermal performance and package reliability. Having the die paddle partially exposed facilitates improved heat dissipation through convection. In addition, the electrical performance of the semiconductor device is increased by reducing the loop inductance.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A semiconductor device, comprising:
   a die paddle including a heat dissipation device integral therewith;
   a pocket formed in the die paddle;
   a semiconductor die thermally coupled with the die paddle;
   a package encompassing at least a portion of the semiconductor die and the die paddle; and
   thermal posts extending from the die paddle, the thermal posts adapted for attaching and aligning the semiconductor device with a printed circuit board.

2. The semiconductor device as recited in claim 1, wherein the package fully encompasses the die paddle.

3. The semiconductor device as recited in claim 1, wherein the package encompasses about 50% of the die paddle.

4. The semiconductor device as recited in claim 1, wherein the package encompasses about 80% of the die paddle.

5. The semiconductor device as recited in claim 1, wherein the package encompasses about 95% of the die paddle.

6. The semiconductor device as recited in claim 1, wherein the package encompasses 50%–95% of the die paddle.

7. The semiconductor device as recited in claim 1, wherein the package is formed of plastic.

8. The semiconductor device as recited in claim 1, wherein the semiconductor die is coupled with the die paddle with a thermally conductive paste.

9. The semiconductor device as recited in claim 1, wherein the semiconductor die is coupled with the die paddle with a non-conductive paste.

10. The semiconductor device as recited in claim 1, wherein the semiconductor die is coupled with the die paddle with double-sided tape.

11. The semiconductor device as recited in claim 1, further comprising at least one lead electrically coupled with the semiconductor die, where the package encompasses a portion of the at least one lead.

12. The semiconductor device as recited in claim 1, further comprising a means for electrically connecting at least one lead with the semiconductor die.

13. The semiconductor device as recited in claim 1, further comprising a plurality of leads coupled with the semiconductor die.

14. The semiconductor device as recited in claim 1, wherein the pocket is etched on the die paddle.

15. The semiconductor device as recited in claim 1, wherein the die paddle is defined in part by a die paddle surface area and the package is defined by a package surface area, and the die paddle surface area is maximized relative to the package surface area.

16. The semiconductor device as recited in claim 1, wherein the die paddle comprises a ground plane.

17. The semiconductor device as recited in claim 1, wherein the die paddle is defined by a top edge and side edges, and the package encompasses the side edges and not the top edge.

18. The semiconductor device as recited in claim 1, wherein the die paddle is defined by a front surface and a rear surface, the semiconductor die is disposed on the front surface and the rear surface is exposed to an environment.

19. A circuit board assembly, comprising:
   a semiconductor device electrically coupled with a printed circuit board, the semiconductor device comprising:
      a die paddle including a heat dissipation device integral therewith;
      a pocket formed in the die paddle
      a semiconductor die thermally coupled with the die paddle;
      a package encompassing at least a portion of the semiconductor die and the die paddle; and thermal posts extending from the heat dissipation device, the thermal posts adapted for attaching and aligning the semiconductor device with a printed circuit board.

20. The circuit board assembly as recited in claim 19, wherein the package fully encompasses the die paddle.

21. The circuit board assembly as recited in claim 19, wherein the package encompasses about 50% of the die paddle.

22. The circuit board assembly as recited in claim 19, wherein the package encompasses about 80% of the die paddle.

23. The circuit board assembly as recited in claim 19, wherein the package encompasses about 95% of the die paddle.

24. The circuit board assembly as recited in claim 19, wherein the package encompasses 50%–95% of the die paddle.

25. The circuit board assembly as recited in claim 19, further comprising thermal posts extending from the die paddle, the thermal posts adapted for attaching and aligning the circuit board assembly with a printed circuit board.

26. The circuit board assembly as recited in claim 19, wherein the package is formed of plastic.

27. The circuit board assembly as recited in claim 19, wherein the semiconductor die is coupled with the die paddle with a thermally conductive paste.

28. The circuit board assembly as recited in claim 19, wherein the semiconductor die is coupled with the die paddle with a non-conductive paste.

29. The circuit board assembly as recited in claim 19, wherein the semiconductor die is coupled with the die paddle with double-sided tape.

30. The circuit board assembly as recited in claim 19, further comprising at least one lead electrically coupled with the semiconductor die, where the package encompasses a portion of the at least one lead.

31. The circuit board assembly as recited in claim 19, further comprising a means for electrically connecting the at least one lead with the semiconductor die.

32. The circuit board assembly as recited in claim 19, further comprising a plurality of leads coupled with the semiconductor die.

33. The circuit board assembly as recited in claim 19, wherein the pocket is etched on the die paddle.

34. The circuit board assembly as recited in claim 19, wherein the die paddle is defined in part by die paddle surface area and the package is defined in part by a package surface area, and the die paddle surface area is maximized relative to the package surface area.

35. The circuit board assembly as recited in claim 19, wherein the die paddle comprises a ground plane.

36. The circuit board assembly as recited in claim 19, wherein the die paddle is defined by a top edge and side edges, and the package encompasses the side edges and not the top edge.

37. The circuit board assembly as recited in claim 19, wherein the die paddle is defined by a front surface and a rear surface, the semiconductor die disposed on the front surface and the rear surface exposed to an environment.

38. A method for forming a semiconductor device, comprising:

forming a die paddle of electrically conductive material;

forming a pocket in the die paddle;

forming a heat dissipation device integral with the die paddle;

attaching a semiconductor die to the die paddle; and encompassing a portion of the die paddle with a package body.

39. The method for forming the semiconductor device as recited in claim 38, wherein encompassing at least a portion of the die paddle comprises molding the package body to encompass a portion of the die paddle therein.

40. The method for forming the semiconductor device as recited in claim 38, wherein encompassing at least a portion of the die paddle comprises encompassing about 50% of the die paddle with the package body.

41. The method for forming the semiconductor device as recited in claim 38, wherein encompassing at least a portion of the die paddle comprises encompassing about 80% of the die paddle with the package body.

42. The method for forming the semiconductor device as recited in claim 38, wherein encompassing at least a portion of the die paddle comprises encompassing about 95% of the die paddle with the package body.

43. The method for forming the semiconductor device as recited in claim 38, wherein encompassing at least a portion of the die paddle comprises encompassing about 50%–95% of the die paddle with the package body.

44. The method for forming the semiconductor device as recited in claim 38, further comprising forming a means for aligning the semiconductor die on the die paddle.

45. The method for forming the semiconductor device as recited in claim 38, wherein forming the pocket comprises etching a pocket for the semiconductor die on the die paddle.

46. A method for cooling a semi-conductor device, comprising:

forming a die paddle of electrically conductive material;

forming a pocket in the die paddle;

attaching a semiconductor die to the die paddle;

dissipating heat generated by the semiconductor die via the die paddle and thermal posts coupled with the die paddle;

encompassing the die paddle with a package body; and increasing the size of the die paddle relative to the package body.

47. The method as recited in claim 46, wherein encompassing the die paddle includes encapsulating the die paddle with a plastic package.

48. The method as recited in claim 46, wherein the step of attaching the semiconductor die includes pasting the semiconductor die to the die paddle with a thermally conductive paste.

49. The method as recited in claim 46, wherein the step of attaching the semiconductor die includes pasting the semiconductor die to the die paddle with a non-conductive paste.

50. The method as recited in claim 46, wherein the step of attaching the semiconductor die includes securing the semiconductor die to the die paddle with double-sided tape.

* * * * *